US006803284B2

(12) United States Patent
Hwang

(10) Patent No.: US 6,803,284 B2
(45) Date of Patent: Oct. 12, 2004

(54) METHOD FOR MANUFACTURING EMBEDDED NON-VOLATILE MEMORY WITH TWO POLYSILICON LAYERS

(75) Inventor: Chong Jen Hwang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 173 days.

(21) Appl. No.: 10/361,419

(22) Filed: Feb. 10, 2003

(65) Prior Publication Data

US 2004/0157393 A1 Aug. 12, 2004

(51) Int. Cl.[7] .......................................... H01L 21/8234
(52) U.S. Cl. ...................................................... 438/275
(58) Field of Search ................................. 438/275, 276, 438/277, 278

(56) References Cited

U.S. PATENT DOCUMENTS

| | | | |
|---|---|---|---|
| 5,780,341 A | 7/1998 | Ogura | |
| 5,966,603 A | 10/1999 | Eitan | |
| 6,043,133 A | 3/2000 | Jang et al. | |
| 6,146,950 A | 11/2000 | Sheu et al. | |
| 6,171,901 B1 | 1/2001 | Blair et al. | |
| 6,177,703 B1 | 1/2001 | Cunningham | |
| 6,191,000 B1 | 2/2001 | Huang et al. | |
| 6,277,676 B1 | 8/2001 | Wu | |
| 6,337,242 B1 | 1/2002 | Park | |
| 6,417,072 B2 | 7/2002 | Coronel et al. | |
| 6,440,798 B1 | 8/2002 | Lai et al. | |
| 6,492,224 B1 | 12/2002 | Jao | |
| 6,620,693 B2 * | 9/2003 | Lai et al. | 438/275 |

FOREIGN PATENT DOCUMENTS

JP          2001077220          3/2001

* cited by examiner

Primary Examiner—David Nelms
Assistant Examiner—Quoc Hoang
(74) Attorney, Agent, or Firm—Mark A. Haynes; Haynes Beffel & Wolfeld LLP

(57) ABSTRACT

A process uses two layers of polysilicon for fabricating high-density nonvolatile memory, such as mask ROM or SONOS memory, integrated with advanced peripheral logic on a single chip. The method includes covering a gate dielectric layer with a first layer of polysilicon in the array portion and in the non-array portion; covering the first layer of polysilicon with a layer of silicon nitride; using two masks for gate electrode formation in a first layer of polysilicon and bit line implant processes; depositing a dielectric material among the gate electrode structures to fill gaps among the gate structures; planarizing the deposited oxide; removing said layer of silicon nitride and applying a second layer of polysilicon material; patterning wordlines in the array portion over said gate electrode structures, and transistor gate structures in said non-array portion, and applying LDD, silicide and other logic circuit processes.

33 Claims, 8 Drawing Sheets

METHOD FOR MANUFACTURING EMBEDDED NON-VOLATILE MEMORY WITH TWO POLYSILICON LAYERS

BACKGROUND OF THE INVENTION

1. Field of the Invention

The present invention relates to manufacturing non-volatile memory, having small critical dimensions, particularly suited as embedded memory on complex integrated circuits.

2. Description of Related Art

As the size of components on integrated circuits shrinks, the degree of integration of functional units on a single chip is increasing. Thus, many chips are being designed which include embedded nonvolatile memory along with logical components, such as memory controllers, general-purpose processors, input/output interface logic, dedicated logic, digital signal processors, and a wide variety of other functional units.

The small dimensions of components on complex integrated circuits present design difficulties. For example, the small width of diffusion conductors increases the resistance of the conductors. Thus, it is known to use technology known as salicide, or other technology, to form a highly conductive layer on the surface of the diffusion conductors to decrease the resistance. According to the well-known salicide process, a silicide such as tungsten silicide is formed on the surface of the diffusion conductors using a self-aligned deposition process. However, application of the salicide process is incompatible with some processes for forming high-density memory cells.

For example, one step used in the salicide process is sidewall formation. The sidewalls are used for masks in the self-alignment step. Sidewall formation includes an etch step, often a plasma based etch, by which the layer of oxide, or other sidewall material, is etched back to the underlying dielectric layer in regions over diffusion conductors. This etch back step can damage the surface of the silicon substrate, resulting in a damaged surface across which a leakage path can be formed. This leakage path can be damaging particularly in high-density memory arrays, causing soft breakdown of the memory.

Another problem that arises because of the high-density of modern technologies is the so-called short channel effect. Because the channel lengths in small dimension transistors are so small, diffusion of dopants implanted to form source and drain regions due to oxidation and thermal processes that occur after the implant can undesirably shorten the channels of the transistors. These effects occur because of so-called thermally enhanced diffusion TED and so-called oxidation enhanced diffusion OED.

It is desirable, therefore, to provide a manufacturing process suitable for combined manufacturing of high-density nonvolatile memory with advanced logic peripheral circuits, which reduces or minimizes effects of small dimension components, such as the short channel effect, the soft breakdown effect due to oxide damage, the high resistance of narrow diffusion conductors, and the like.

SUMMARY OF THE INVENTION

The present invention provides a process using two layers of polysilicon for fabricating high-density nonvolatile memory, such as mask ROM or SONOS memory, integrated with advanced peripheral logic on a single chip. An embodiment of the present invention provides a method for manufacturing an integrated circuit on the substrate, including nonvolatile memory in an array portion of the substrate and other circuitry in a non-array portion of the substrate. The method includes integrated circuit manufacturing steps comprising:

forming gate dielectric layers in the array portion and in the non-array portion of the substrate;

covering the gate dielectric layer with a first layer of polysilicon in the array portion and in the non-array portion of the substrate;

covering the first layer of polysilicon with a layer of silicon nitride in the array portion and in the non-array portion of the substrate;

patterning lines in a wordline direction in the array portion, and etching said layer of silicon nitride and said first layer of polysilicon to form line structures;

patterning lines orthogonal to the wordline direction in the array portion over said line structures, and etching said line structures to form gate electrode structures, the gate electrode structures including remaining portions of said first polysilicon layer and said silicon nitride layer;

implanting dopants into the substrate through the gate dielectric layer between the lines orthogonal to the wordline direction;

removing said lines orthogonal to the wordline direction;

depositing a dielectric material among the gate electrode structures to fill gaps among the gate structures;

planarizing the array portion and the non-array portion to a level exposing said silicon nitride layer and said dielectric material in the gaps among the gate electrode structures;

removing said layer of silicon nitride from said non-array portion and from said gate structures, leaving the remaining portions of said first layer of polysilicon and said dielectric material filling the gaps among the gate electrode structures;

covering the remaining portions of said first layer of polysilicon and said dielectric material filling the gaps among the gate electrode structures with a second layer of polysilicon material;

patterning wordlines in the array portion over said gate electrode structures, and transistor gate structures in said non-array portion, and etching the remaining portions of said first layer of polysilicon and said second layer of polysilicon according to the patterning, to form wordlines in the array portion and transistor gate structures in the non-array portion;

implanting dopants to form source and drain regions in the non-array portion;

forming self aligned silicide in source and drain regions in the non-array portion;

applying a dielectric layer over the array portion and the non-array portion; and applying patterned metallization over the dielectric layer.

The first polysilicon layer as deposited in various embodiments has a thickness of around 300 Angstroms, and preferably in a range of about 200 to about 450 Angstroms. The nitride layer as deposited in various embodiments has a thickness of around 300 Angstroms, and preferably in a range of about 200 to about 450 Angstroms. The second polysilicon layer as deposited in various embodiments has a thickness of around 1500 Angstroms, and preferably in a range of about 1300 to about 1600 Angstroms.

Embodiments of the invention also include so-called lightly doped drain LDD processes to improve transistor performance, particularly in the peripheral circuitry. Thus, in embodiments including the LDD processes, the method of implanting dopants to form source and drain regions in the non-array portion includes implanting a first dopant aligned with the transistor gate structures, forming sidewall spacers on the transistor gate structures, and implanting a second dopant aligned with the sidewall spacers. Silicide is formed, in these LDD embodiments, using processes self-aligned with the sidewall spacers. In some embodiments, the sidewall spacers are made using silicon nitride, or other material that is different than the material of the deposited dielectric and gate dielectric layer, so that a selective etch process can be used during formation of the sidewall spacers, to minimize damage of the underlying gate dielectric layer.

Embodiments of the invention use chemical vapor deposition to deposit the dielectric material among the gate structures to fill gaps among the gate structures. Preferably, plasma enhanced chemical vapor deposition, or another low-temperature chemical vapor deposition process, is used. For example, deposition processes in which the deposition temperature is less than 650 degrees Celsius are preferable.

The step of planarizing is accomplished using chemical mechanical polishing in embodiments of the manufacturing method, to further reduce the thermal "budget" on the manufacturing process.

The manufacturing process outlined above is applicable to mask ROM embedded memory arrays, as well as to embedded, electrically programmable and erasable memory arrays using so-called SONOS memory cells, which have gate dielectrics based on a composite layer, including a bottom dielectric layer, such as silicon dioxide, a charge trapping dielectric layer such as silicon nitride, and a top dielectric layer, such as silicon dioxide.

Thus, the present invention provides a fabrication process relying on two polysilicon layers for embedded flat mask ROM arrays, and embedded flat SONOS arrays, in complex integrated circuits. Source and drain buried diffusion layers are formed using an implantation process after formation of the gate polysilicon electrodes, reducing the thermally enhanced diffusion and oxidation enhanced diffusion effects that may cause a short channel. The low-temperature deposition and chemical mechanical polishing processes form thick dielectric layers between wordlines and the gate structures, to prevent soft breakdown between buried diffusion layers and wordlines. The patterning of the first layer of polysilicon process uses two masks, by which cleanly rectangular or square gate electrodes are formed in the first polysilicon layer which are interconnected along wordlines formed from the second polysilicon layer. The second polysilicon layer is used to form wordlines interconnecting the gate electrode structures in the array portion, and to form transistor gate structures for the peripheral circuitry. A silicon nitride sidewall spacer process is used to enhance etch selectivity during formation of the sidewalls, preventing spacer etch damage of dielectric layers and reducing the problems with leakage caused by damage to surfaces on the dielectrics between buried diffusion regions.

Other aspects and advantages of the present invention can be seen on review of the drawings, the detailed description and the claims, which follow.

DETAILED DESCRIPTION

Figure 1A:
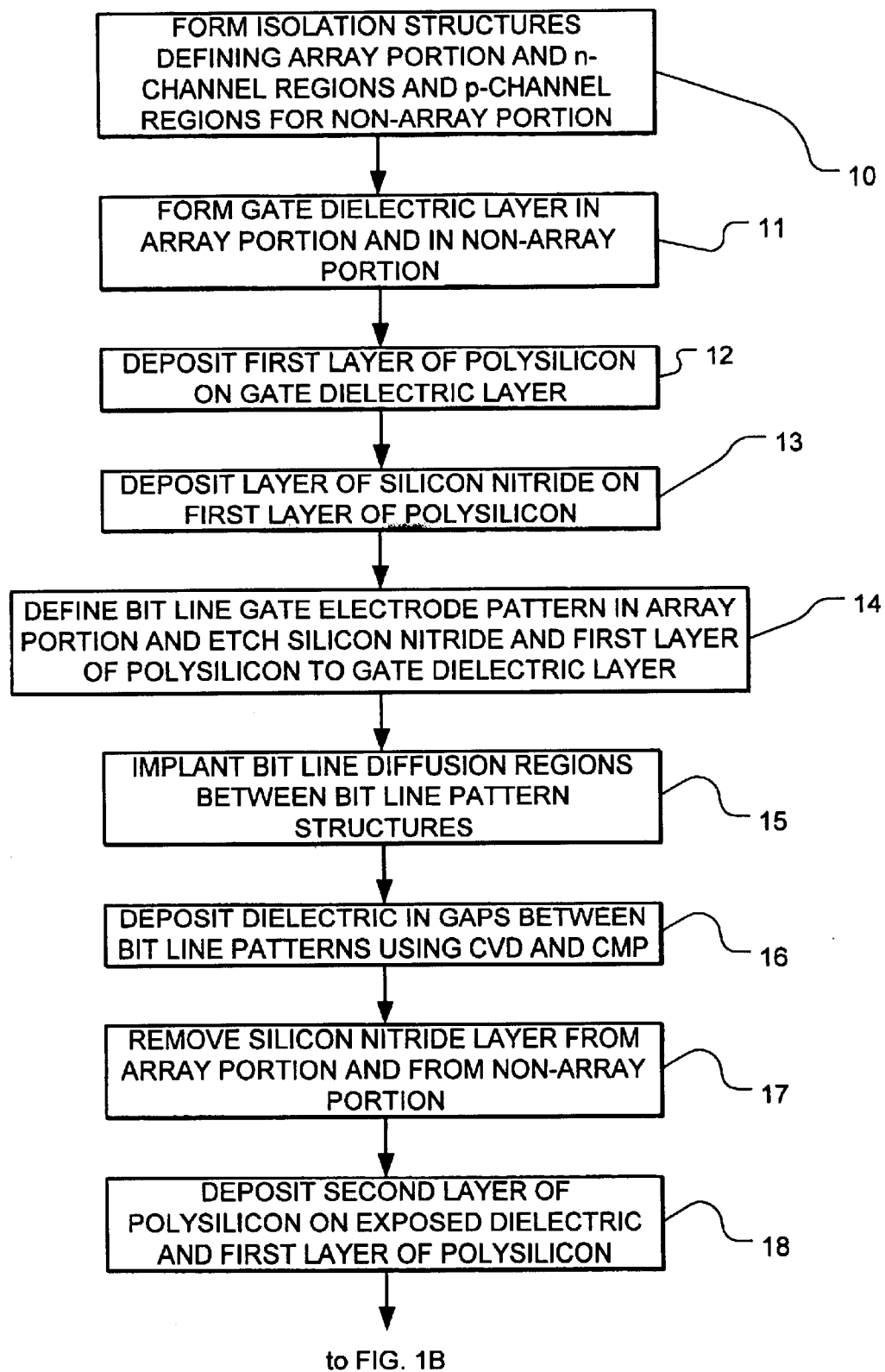
FIGS. 1A and 1B are a flow diagram illustrating a manufacturing process according to the present invention.
Figure 1B:
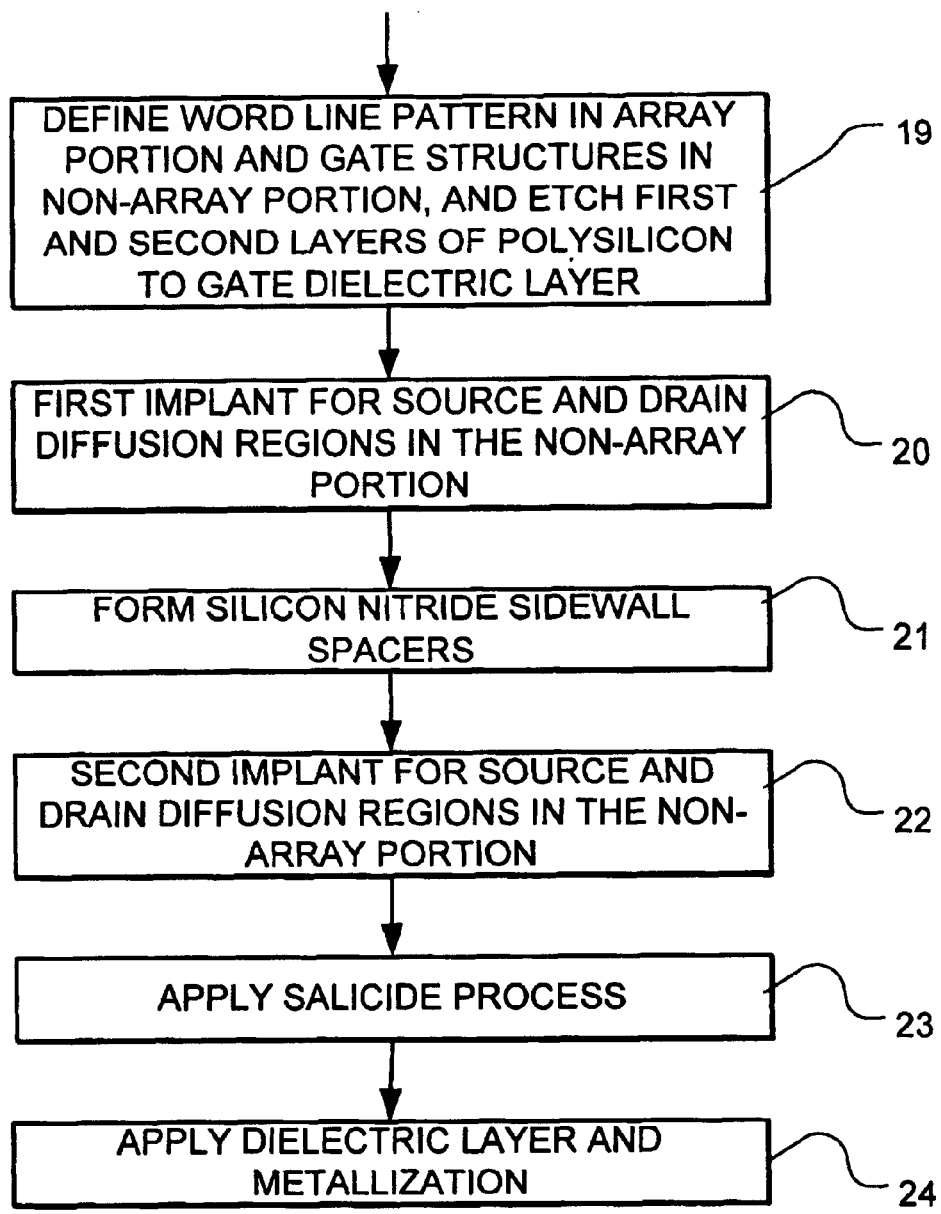

A detailed description of embodiments of the present invention is provided with reference to the figures, in which FIGS. 1A and 1B illustrate a basic flow for the manufacturing process. The structures at various steps in the manufacturing process are shown in FIGS. 2–10 for mask ROM based embedded memory devices. FIG. 11 illustrates application of the process to SONOS based embedded memory devices.

Figure 2:
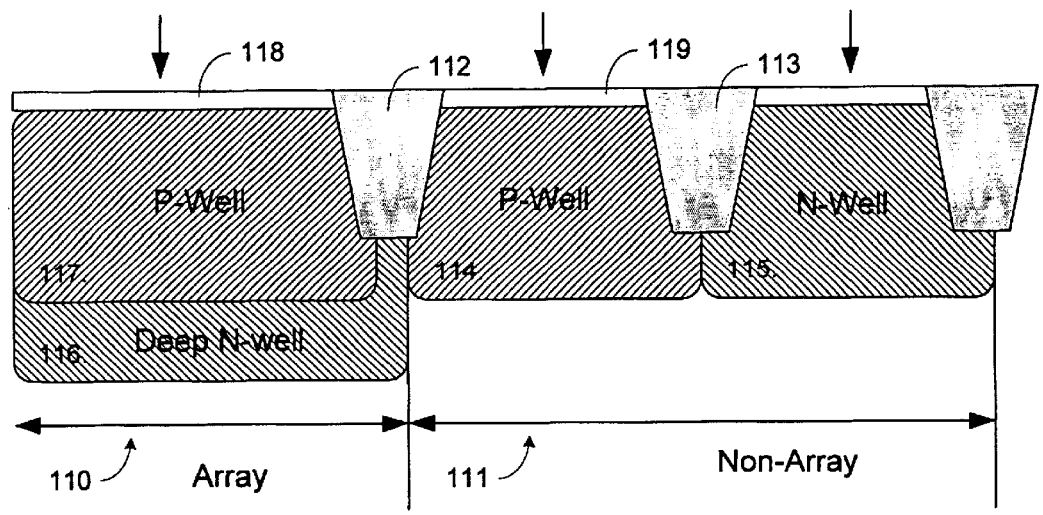
FIGS. 2–10 illustrate structures at steps in an embodiment of the manufacturing process for a complex integrated circuit including an embedded mask ROM.

A first step in the manufacturing process is to form isolation structures that define an array portion 110 and a non-array portion 111 of the substrate (block 10). FIG. 2 provides a view of a resulting structure. In the example shown in FIG. 2, the array portion 110 is isolated from the non-array portion by dielectric region 112. The dielectric region 112 is formed by depositing oxide or other dielectric within a trench, by LOCOS oxidation, or otherwise as known in the art. The non-array portion 111 is divided into an n-channel region and a p-channel region by dielectric regions 113 for typical CMOS implementation of logic circuits. The n-channel region is defined by p-type well 114 in which n-channel devices are formed. The p-channel region is defined by the deep n-type well 115 in which p-channel devices are formed. In this example, the array portion 110 includes a deep n-type well 116, in which a p-type well 117 is formed. N-channel memory devices are formed in the p-type well 117. In one example process, a retrograde well formation process is used to create the deep well structure and to apply Vt implants in the memory cell region. The process includes two retrograde well processes IS including a well implant→ anti-punch through implant→ and Vt implant using the same mask. Two masking layers are then used in this example to form the n-type well 116 and the p-type well 117 according to the retrograde well approach. For the NMOS devices, representative implant recipes include a Vt implant using BF2 with 50K~80K KeV, with a concentration of about 1E12 dose/cm^2, an anti-punch implant using B with 50K~80K KeV, with a concentration of about 1E12 dose/cm^2, and a well implant using B with 150K~250K KeV, with a concentration of about 1E13 dose/cm^2. For the PMOS devices, representative implant recipes include a Vt implant using P at 100~120K KeV, with a concentration of about 2E12 dose/cm^2, an anti-punch implant using P at 250K~300K KeV, with a concentration of about 2E12 dose/cm^2, and a well implant using P at 550K~600K KeV, with a concentration of about 1E13 dose/cm^2. This combination of well structures in the array portion 110 is used for isolation purposes in some embodiments.

In a next step (block 11) of FIG. 1A, a gate dielectric layer 118 is formed in the array portion and a gate dielectric layer 119 is formed in the non-array portion. The gate dielectric layer 118 in the array portion may be formed in the same process step as the gate dielectric layer 119 formed in the non-array portion, or different processes may be used so as to establish different parameters for the gate dielectrics in the various regions. For example, in SONOS based memory embodiments, the gate dielectric layer 118 is implemented with a composite dielectric layer as shown in FIG. 11, while the gate dielectric layer 119 in the non-array portion remains a single layer of silicon dioxide.

Figure 3:
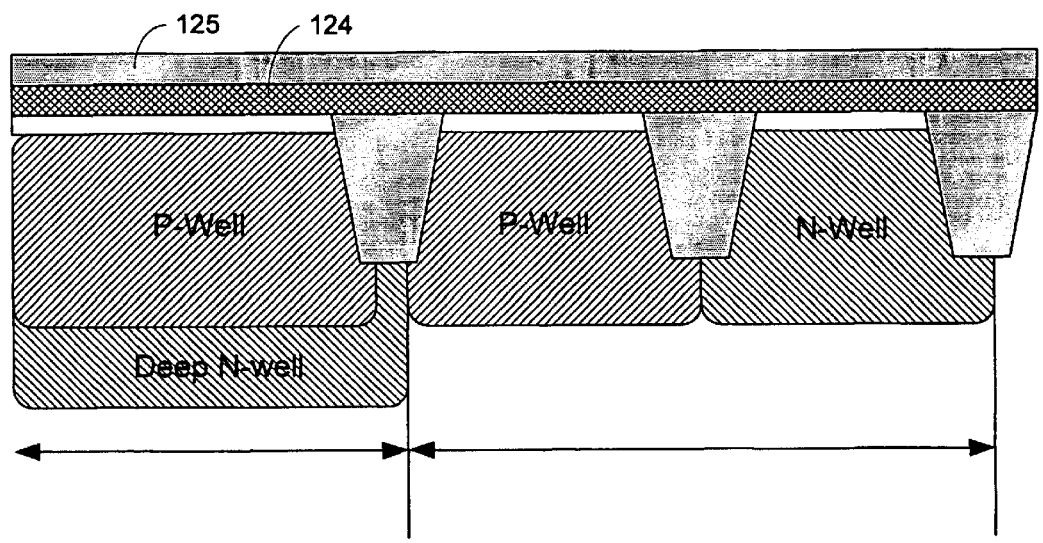

After formation of the gate dielectric layers 118, 119, a first layer of polysilicon is deposited (block 12). Next, a layer of silicon nitride is deposited on the first layer of polysilicon (block 13). The resulting structure is shown in FIG. 3. Thus, a polysilicon layer 124 overlies the gate dielectrics in the array portion 110 and in the non-array portion 111. The polysilicon layer 124 may have a thickness between about 100 and 1000 angstroms in a representative device. More preferably, the polysilicon layer 124 is around 300 Angstroms thick, such as between about 200 and about 450 Angstroms thick. The silicon nitride layer 125 overlies the polysilicon layer 124, and in this example also has a thickness between about 100 and 1000 angstroms. More preferably, the silicon nitride layer 125 is around 300 Angstroms thick, such as between about 200 and about 450 Angstroms thick.

Figure 4:
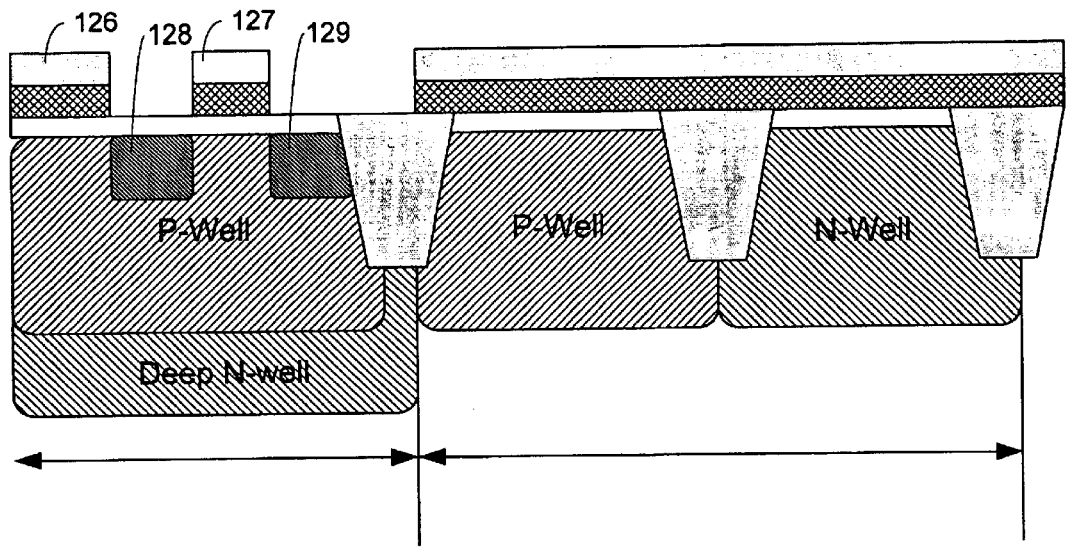

In a next process step (block 14), a bit line and gate electrode pattern on the array portion is defined, and the silicon nitride and first layer of polysilicon are etched to expose the gate dielectrics in the array portion. A two mask process is utilized, including a first photoresist pattern step defining stripes in a wordline direction. The layer of silicon nitride and first layer of polysilicon are etched according to this first photoresist pattern. The photoresist is stripped, and a second photoresist pattern step defining stripes orthogonal to the wordline direction, that is in the bit line direction, is applied. The remaining portions of the layer of silicon nitride and first layer of polysilicon between the stripes in the bit line direction down to the gate dielectric layer in the array portion are removed, leaving gate electrode structures comprising stacks including remnants of the first layer of polysilicon and the layer of silicon nitride. Next, buried diffusion bit lines are implanted through the exposed gate dielectric using this second photoresist pattern of stripes in the bit line direction as an implant mask (block 15). One example recipe for the buried diffusion BD implant includes a "pocket" p-type implant of boron B with an implant energy of 15~40K KeV, and concentration of 15E13 atom/cm^2, after an n-type BD implant of arsenicAs with an implant energy of 30~60K KeV, and a concentration of 2~3.5E15 atom/cm^2. Of course, as with all implant processes, these energies and concentrations are fine tuned according to the structures and processes of the particular chip and particular fab. Finally, the second photoresist pattern is stripped. A structure resulting from this process is shown in FIG. 4, which represents a cross-section parallel to the wordline direction in the array. Thus, in the array portion, gate electrode structures 126 and 127 are left in an array pattern in the array portion of the substrate.

The gate electrode structures 126 and 127 have a sharp rectangular or square shape as a result of the two mask process used to define them. Buried diffusion bit lines 128 and 129 extend in the bit line direction across the array portion. The buried diffusion bit lines 128 and 129 are formed after deposition of the gate electrode structures 126 and 127, so that the process used to form the gate dielectric 118 does not cause oxidation enhanced diffusion under the gate electrode structures.

Figure 5:
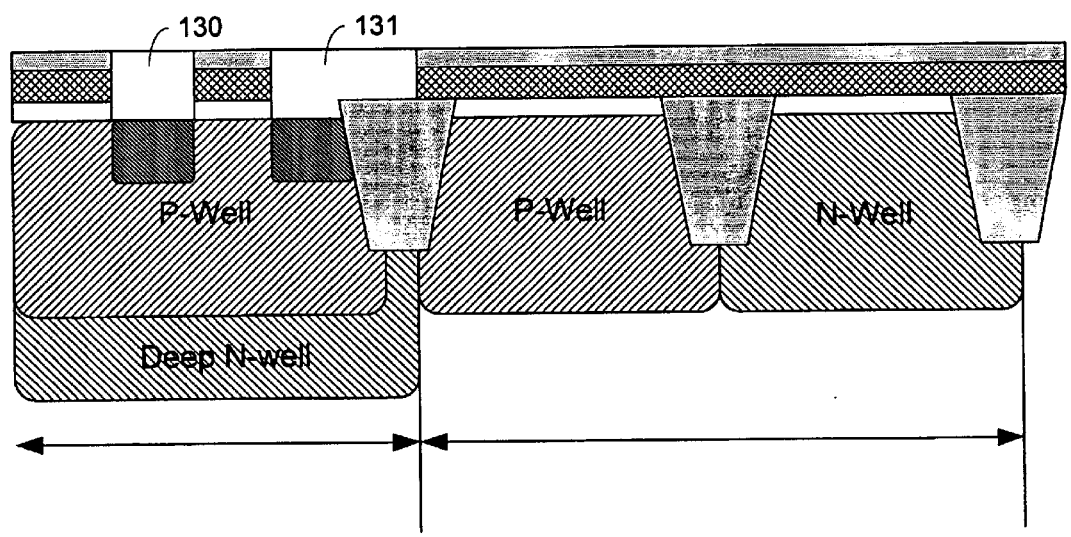

In a next process step (block 16), dielectric is deposited in the array portion filling in the gaps among the gate electrode structures. The deposition technique in one embodiment comprises chemical vapor deposition or plasma enhanced chemical vapor deposition of a dielectric material comprising silicon dioxide, during which deposition the chamber wall temperature is kept as low as practical, for example less than about 650 degrees Celsius. In one example, the etch chemistry comprises TEOS/O2 mixed-chemical with a chamber wall temperature of 630 degrees Celsius. In embodiments of the invention, other deposition processes may be executed in which the temperature is less than about 650 degrees Celsius. After deposition of the dielectric material, a planarization process is executed. Preferably, low-temperature chemical mechanical polishing CMP is used, rather than for example, a thermal process involving reflow. In processes using chemical mechanical polishing CMP, after deposition of the dielectric material in the gaps the so-called reverse cell gate process is applied to improve CMP uniformity. The reverse cell gate process includes the photoresist pattern, etch, and photoresist pattern strip in order to reduce the pattern density dependence of the deposited dielectric prior to polishing. A resulting structure is shown in FIG. 5, in which oxide plugs 130 and 131 fill the gaps between the gate electrode structures 126 and 127, and have a planar top surface.

Figure 6:
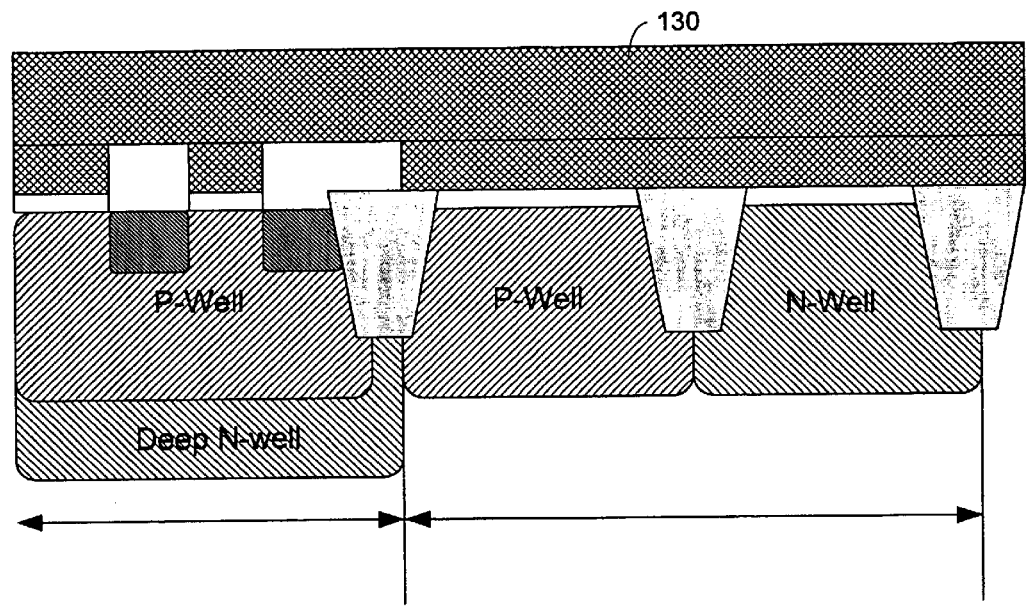

After planarization, the silicon nitride layer is removed from both the array portion and the non-array portion (block 17). Next, a second layer of polysilicon 130 is deposited on the exposed dielectric and the first layer of polysilicon (block 18). The resulting structure is shown in FIG. 6, in which the silicon nitride layer (layer 126 of the previous figures) has been removed and the second polysilicon layer 130 has been deposited. The polysilicon layer 130 is around 1500 Angstroms thick, such as between about 1300 Angstroms and about 1600 Angstroms.

Figure 7:
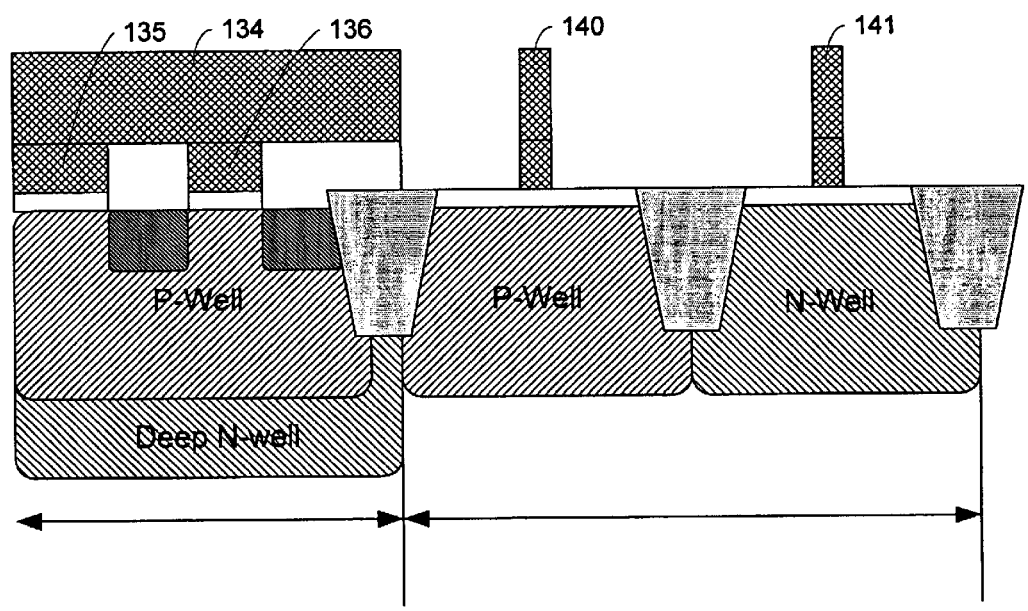

After deposition of the second layer of polysilicon, a photoresist pattern is formed to define wordlines in the array portion and gate structures in the non-array portion of the substrate. The first layer of polysilicon and the second layer of polysilicon 130 are etched according to the pattern to expose the underlying gate dielectric layer (block 19). The resulting structure is shown in FIG. 7, in which wordline structures 134 and gate structures 140 and 141 are shown. Gate electrode structures 135, 136 underlie the wordline polysilicon 134 in the memory cell regions.

Figure 8:
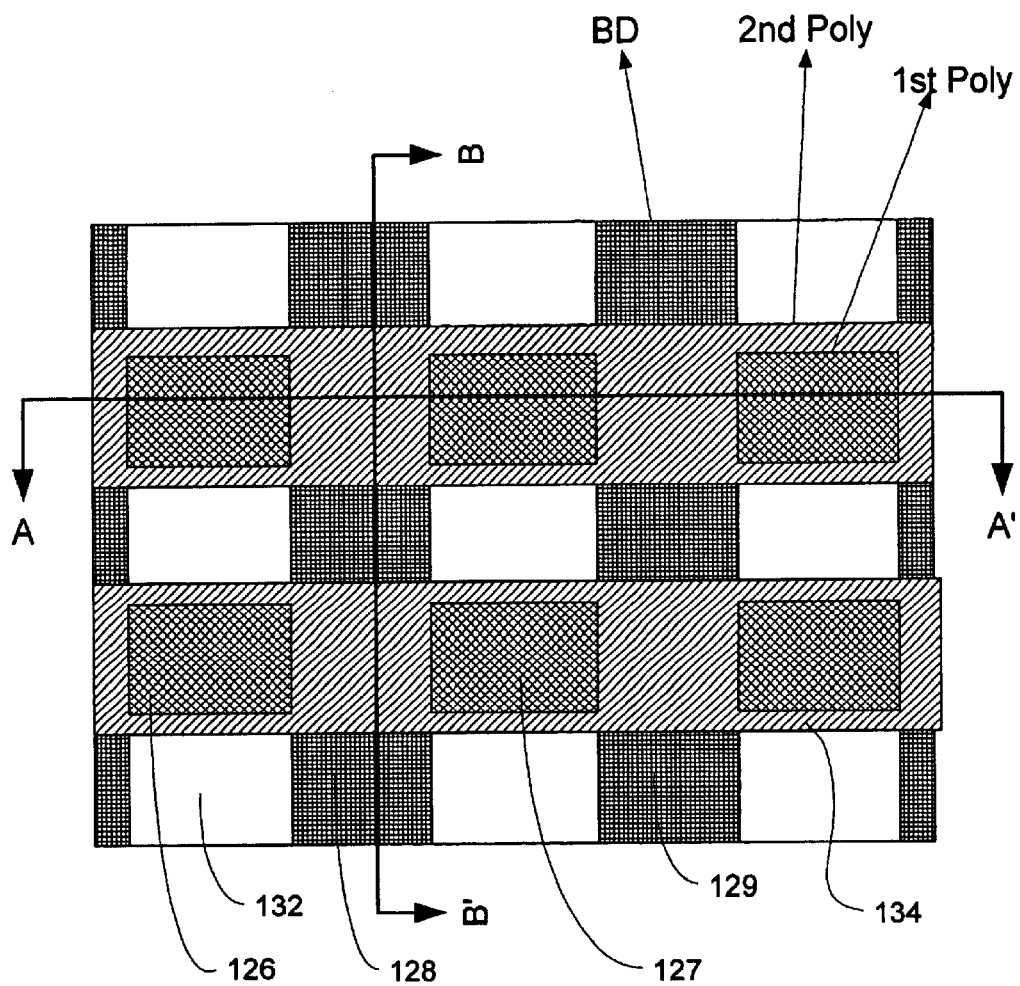

A plan view of the resulting structure is shown in FIG. 8. Buried diffusion bit lines 128, 129 extend vertically on the page in the FIG. 8, and are crossed by the wordline structures 134. Gate electrode structures 126, 127 are shown in the FIG. 8, even though they completely underlie wordline structures 134. CVD oxide regions, e.g. 132, fill the gaps among the gate electrode structures, and overlie the buried diffusion bit lines 128, 129 beneath the wordline structures 134. The wordline polysilicon 134 is slightly wider than the gate electrode structures 132, 133 for improved conductivity, and to account for mask alignment issues.

Figure 9:
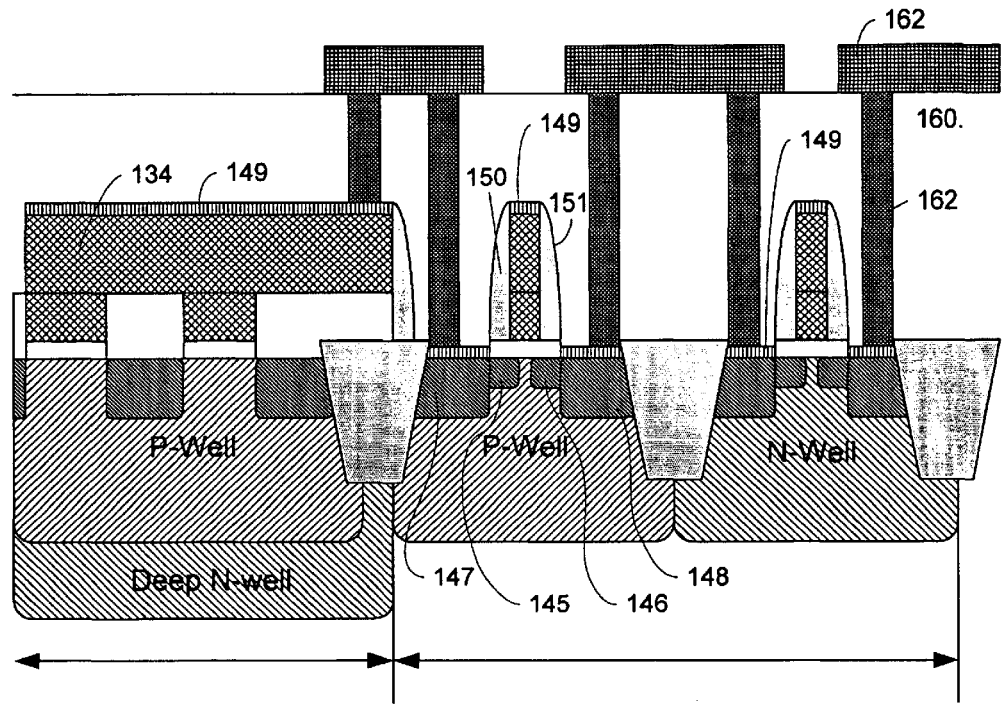

In a next process step, a re-oxidation step followed by lightly doped drain LDD processes are applied, beginning with a first implantation step in the non-array portion, aligned with the gate structures 140, 141 (block 20). The structure can be seen in FIG. 9, which shows a cross-section parallel with the wordline 134. This first implantation results in a diffusion region 145 and a diffusion region 146 closely aligned with the sides of the gate structure 140. Next, silicon nitride sidewall spacers are formed, by depositing a layer of silicon nitride, and then anisotropically etching the silicon nitride down to the underlying structures. One example SiN deposition recipe includes N2/NH3/SiH2Cl2 mixed-chemical chemical vapor deposition with a chamber wall temperature of 730° C. The silicon nitride is etched in one example process using a dry etch (e.g. 75mt/1600W/C4F8/Ar/CH3F) where mt means milli-torr and W is watts, mixed-chemical with endpoint set to stop etch process on the SiO2 gate dielectric layer. As seen in FIG. 9, this etch step results in sidewalls, e.g. 150, 151, on the structures on the substrate (block 21). The LDD processes in the non-array portion are completed by a second implantation step, aligned with the sidewall spacers (block 22). As seen in FIG. 9, this results in the diffusion regions 147, 148 aligned with the sidewall spacers 150, 151 and spaced away from the sides of the gate structure 140, while overlapping with the diffusion regions 145 and 146. The spacers are formed using silicon nitride in this embodiment to improve selectivity of the etch back step used for sidewall formation with the underlying dielectric on the surface of the substrate, and with the CVD dielectric in the array portion of the substrate.

In a next step, the self aligned silicide (salicide) process is applied (block 23). As seen in FIG. 9, the salicide process forms conductive silicide 149 over the exposed diffusion regions in alignment with the sidewall spacers, on top of the wordline polysilicon, and on top of the gate structures in the non-array portion. The diffusion bit lines in the array portion of the device are protected from salicide process by the CVD dielectric and sidewall structures.

Finally, a dielectric layer 160, contact vias 161 and patterned metallization 162 are applied to complete the device. For mask ROM, code implants are arranged after SiN removal and before the deposition of the second layer of polysilicon in a representative process flow.

Figure 10:
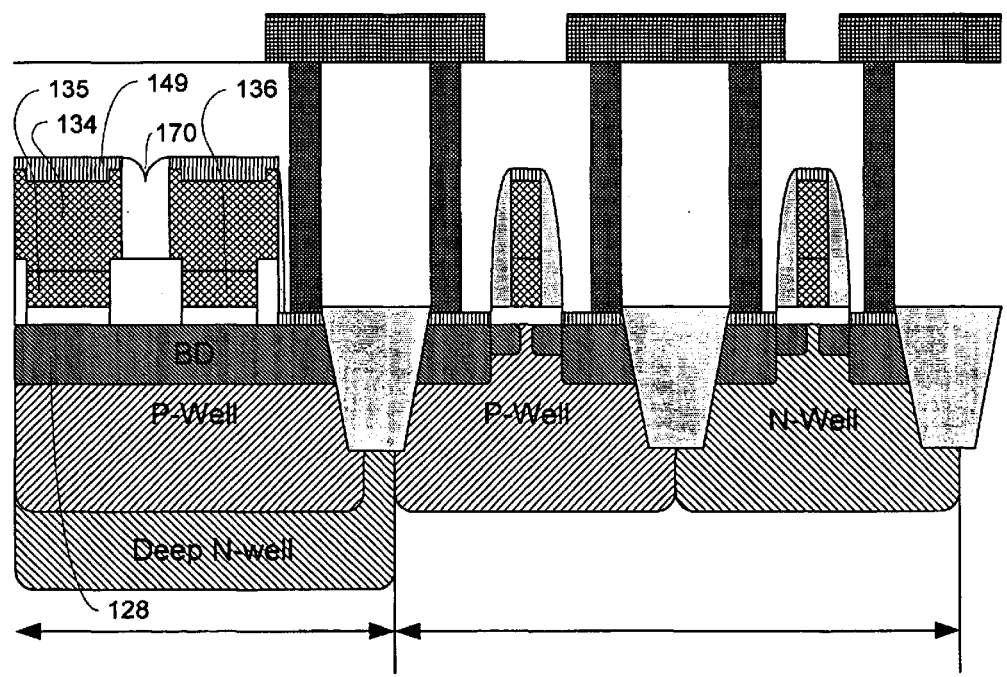
Figure 11:
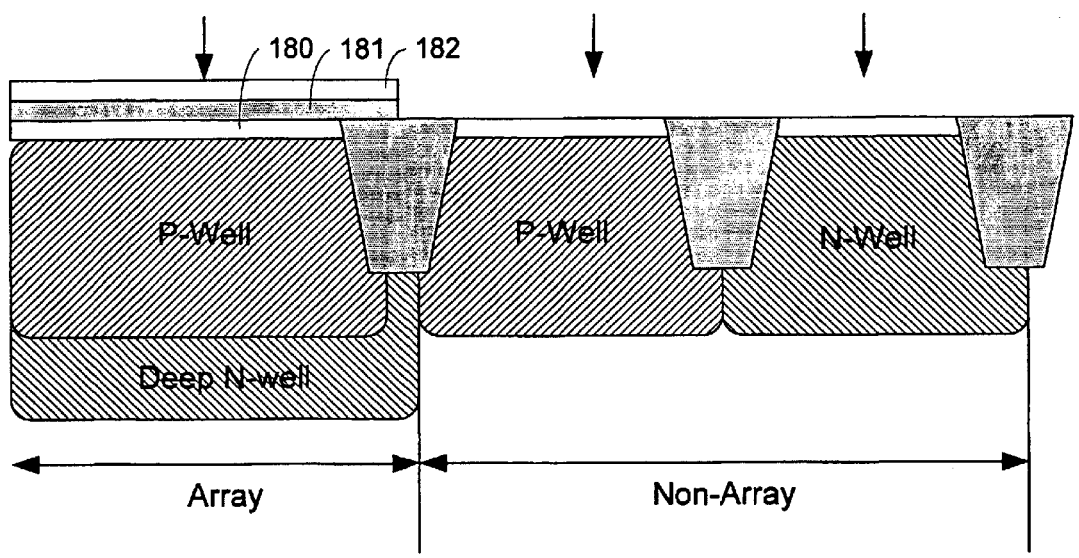
FIG. 11 illustrates application of the process of FIGS. 2–10 to an embedded non-volatile memory based on SONOS cells.

FIG. 10 shows the structure in a cross-section parallel to the buried diffusion bit line 128 in the array portion. FIG. 10 illustrates the CVD dielectric region 165 between gate electrode structures 135, 136. The silicon nitride sidewall spacers 170 fill between the wordline structures 134.

The process described above is also used for embedded nonvolatile memory arrays that include erasable and programmable memory cells, such as SONOS based memory cells. In this embodiment, the gate dielectric 118 in the array portion is replaced by a composite dielectric layer that includes a charge trapping layer. Thus, as shown in FIG. 11, the gate dielectric in a SONOS based array comprises an ONO stacked gate dielectric. The bottom layer 180 of the composite dielectric typically comprises silicon dioxide. The middle layer 181 is used for charge trapping, and typically comprises silicon nitride. The top layer 182 also typically comprises silicon dioxide. The process flow described above in respect to FIGS. 2 through 10 is identical after this formation of the composite gate dielectric layer in the array portion, and not described again.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing an integrated circuit on a substrate, including nonvolatile memory in an array portion of the substrate and other circuitry in a non-array portion of the substrate, comprising:

forming gate dielectric layers in the array portion and in the non-array portion of the substrate;

covering the gate dielectric layers with a first layer of polysilicon in the array portion and in the non-array portion of the substrate;

covering the first layer of polysilicon with a layer of silicon nitride in the array portion and in the non-array portion of the substrate;

patterning lines in a wordline direction in the array portion, and etching said layer of silicon nitride and said first layer of polysilicon to form line structures in the array portion;

patterning lines orthogonal to the wordline direction in the array portion over said line structures, and etching said line structures to form gate electrode structures, the gate electrode structures including remaining portions of said first polysilicon layer and said silicon nitride layer;

implanting dopants into the substrate through uncovered regions of the gate dielectric layer in the array portion, between the lines orthogonal to the wordline direction;

removing said lines orthogonal to the wordline direction;

depositing a dielectric material between the gate electrode structures to fill gaps among the gate structures;

planarizing the array portion and the non-array portion to a level exposing said silicon nitride layer and said dielectric material in the gaps among the gate electrode structures;

removing said layer of silicon nitride from said non-array portion and from said gate structures, leaving the remaining portions of said first layer of polysilicon and said dielectric material filling the gaps among the gate electrode structures;

covering the remaining portions of said first layer of polysilicon and said dielectric material filling the gaps among the gate electrode structures with a second layer of polysilicon material;

patterning wordlines in the array portion over said gate electrode structures, and transistor gate structures in said non-array portion, and etching the remaining portions of said first layer of polysilicon and said second layer of polysilicon according to the patterning to form wordlines in the array portion and transistor gate structures in the non-array portion;

implanting dopants to form source and drain regions in the non-array portion;

forming self aligned silicide in source and drain regions in the non-array portion;

applying a dielectric layer over the array portion and the non-array portion; and applying patterned metallization over the dielectric layer.

2. The method of claim 1, including before said implanting dopants to form source and drain regions in the non-array portion, re-oxidizing the oxide layer in the non-array portion.

3. The method of claim 1, wherein said implanting dopants to form source and drain regions in the non-array portion includes:

implanting a first dopant aligned with the transistor gate structures;

forming sidewall spacers on the transistor gate structures; and implanting a second dopant aligned with the sidewall spacers.

4. The method of claim 1, wherein said implanting dopants to form source and drain regions in the non-array portion includes:

implanting a first dopant aligned with the transistor gate structures;

forming sidewall spacers on the transistor gate structures, and filling between the wordlines in the array portion with the material of the sidewall spacers; and implanting a second dopant aligned with the sidewall spacers.

5. The method of claim 1, wherein said implanting dopants to form source and drain regions in the non-array portion includes:

implanting a first dopant aligned with the transistor gate structures;

forming sidewall spacers using a material other than the deposited dielectric material on the transistor gate structures; and implanting a second dopant aligned with the sidewall spacers.

6. The method of claim 1, wherein said implanting dopants to form source and drain regions in the non-array portion includes:

implanting a first dopant aligned with the transistor gate structures;

forming sidewall spacers using silicon nitride on the transistor gate structures; and implanting a second dopant aligned with the sidewall spacers.

7. The method of claim 1, wherein the gate dielectric layer in the array portion comprises an ONO layer.

8. The method of claim 1, wherein said depositing a dielectric material comprises using chemical vapor deposition to deposit a material comprising silicon dioxide.

9. The method of claim 1, wherein said depositing a dielectric comprises using plasma enhanced chemical vapor deposition to deposit a material comprising silicon dioxide.

10. The method of claim 1, wherein said depositing a dielectric comprises using deposition process with a deposition temperature below 650 degrees Celsius to deposit a material.

11. The method of claim 1, wherein said planarizing includes using chemical-mechanical polishing.

12. The method of claim 1, including, before the covering the remaining portions of said first layer of polysilicon and said dielectric material filling the gaps among the gate electrode structures with a second layer of polysilicon material, implanting ROM codes in the array portion.

13. The method of claim 1, wherein said first layer of polysilicon has a thickness around 300 Angstroms, and said layer of silicon nitride has a thickness around 300 Angstroms.

14. The method of claim 1, wherein said second layer of polysilicon has a thickness around 1500 Angstroms.

15. The method of claim 1, wherein said first layer of polysilicon has a thickness between about 200 Angstroms and about 450 Angstroms, and said layer of silicon nitride has a thickness between about 200 Angstroms and about 450 Angstroms.

16. The method of claim 1, wherein said second layer of polysilicon has a thickness between about 1300 Angstroms and about 1600 Angstroms.

17. A method for manufacturing an integrated circuit on a substrate, including mask ROM memory in an array portion of the substrate and other circuitry in a non-array portion of the substrate, comprising:

forming gate dielectric layers in the array portion and in the non-array portion of the substrate;

covering the gate dielectric layers with a first layer of polysilicon in the array portion and in the non-array portion of the substrate;

covering the first layer of polysilicon with a layer of silicon nitride in the array portion and in the non-array portion of the substrate;

patterning lines in a wordline direction in the array portion, and etching said layer of silicon nitride and said first layer of polysilicon to form line structures in the array portion;

patterning lines orthogonal to the wordline direction in the array portion over said line structures, and etching said line structures to form gate electrode structures, the gate electrode structures including remaining portions of said first polysilicon layer and said silicon nitride layer;

implanting dopants into the substrate through the uncover regions in the gate dielectric layer in the array portion between the lines orthogonal to the wordline direction;

removing said lines orthogonal to the wordline direction;

depositing by chemical vapor deposition with a deposition temperature less than 650 degrees Celsius, a dielectric material between the gate electrode structures to fill gaps among the gate electrode structures;

planarizing the array portion and the non-array portion to a level exposing said silicon nitride layer and said dielectric material in the gaps among the gate electrode structures;

removing said layer of silicon nitride from said non-array portion and from said gate structures, leaving the remaining portions of said first layer of polysilicon and said dielectric material filling the gaps between the gate electrode structures;

covering the remaining portions of said first layer of polysilicon and said dielectric material filling the gaps between the gate electrode structures with a second layer of polysilicon material;

patterning wordlines in the array portion over said gate electrode structures, and transistor gate structures in said non-array portion, and etching the remaining portions of said first layer of polysilicon said second layer of polysilicon according to the patterning to form wordlines in the array portion and transistor gate structures in the non-array portion;

implanting dopants to form source and drain regions in the non-array portion;

forming self aligned silicide in source and drain regions in the non-array portion;

applying a dielectric layer over the array portion and the non-array portion;

applying patterned metallization over the dielectric layer; and implanting ROM codes in the array portion.

18. The method of claim 17, wherein said implanting dopants to form source and drain regions in the non-array portion includes:

implanting a first dopant aligned with the transistor gate structures;

forming sidewall spacers using silicon nitride on the transistor gate structures; and implanting a second dopant aligned with the sidewall spacers.

19. The method of claim 17, wherein said planarizing includes using chemical-mechanical polishing.

20. The method of claim 17, wherein said depositing a dielectric comprises using plasma enhanced chemical vapor deposition to deposit a material comprising silicon dioxide.

21. The method of claim 17, wherein said first layer of polysilicon has a thickness around 300 Angstroms, and said layer of silicon nitride has a thickness around 300 Angstroms.

22. The method of claim 17, wherein said second layer of polysilicon has a thickness around 1500 Angstroms.

23. The method of claim 17, wherein said first layer of polysilicon has a thickness between about 200 Angstroms and about 450 Angstroms, and said layer of silicon nitride has a thickness between about 200 Angstroms and about 450 Angstroms.

24. The method of claim 17, wherein said second layer of polysilicon has a thickness between about 1300 Angstroms and about 1600 Angstroms.

25. A method for manufacturing an integrated circuit on a substrate, including non-volatile memory in an array portion of the substrate and other circuitry in a non-array portion of the substrate, comprising:

forming a composite layer in the array portion and a gate dielectric layer in the non-array portion of the substrate, the composite layer including a bottom dielectric layer, and intermediate charge trapping dielectric layer, and a top dielectric layer;

covering the composite layer and the gate dielectric layer with a first layer of polysilicon in the array portion and in the non-array portion of the substrate;

covering the first layer of polysilicon with a layer of silicon nitride in the array portion and in the non-array portion of the substrate;

patterning lines in a wordline direction in the array portion, and etching said layer of silicon nitride and said first layer of polysilicon to form line structures in the array portion;

patterning lines orthogonal to the wordline direction in the array portion over said line structures, and etching said line structures to form gate electrode structures, the gate electrode structures including remaining portions of said first polysilicon layer and said silicon nitride layer;

implanting dopants into the substrate through uncovered regions in the composite layer between the lines orthogonal to the wordline direction;

removing said lines orthogonal to the wordline direction;

depositing by chemical vapor deposition with a temperature less than 650 degrees Celsius, a dielectric material between the gate structures to fill gaps among the gate structures;

planarizing the array portion and the non-array portion to a level exposing said silicon nitride layer and said dielectric material in the gaps among the gate electrode structures;

removing said layer of silicon nitride from said non-array portion and from said gate electrode structures, leaving the remaining portions of said first layer of polysilicon and said dielectric material filling the gaps among the gate electrode structures;

covering the remaining portions of said first layer of polysilicon and said dielectric material filling the gaps among the gate electrode structures with a second layer of polysilicon material;

patterning wordlines in the array portion over said gate structures, and transistor gate structures in said non-array portion, and etching the remaining portions of said first layer of polysilicon and said second layer of polysilicon according to the patterning to form wordlines in the array portion and transistor gate structures in the non-array portion;

implanting dopants to form source and drain regions in the non-array portion;

forming self aligned silicide in source and drain regions in the non-array portion;

applying a dielectric layer over the array portion and the non-array portion; and applying patterned metallization over the dielectric layer.

26. The method of claim 25, wherein said implanting dopants to form source and drain regions in the non-array portion includes:

implanting a first dopant aligned with the transistor gate structures;

forming sidewall spacers using silicon nitride on the transistor gate structures; and implanting a second dopant aligned with the sidewall spacers.

27. The method of claim 25, wherein said planarizing includes using chemical-mechanical polishing.

28. The method of claim 25, wherein said depositing a dielectric comprises using plasma enhanced chemical vapor deposition to deposit a material comprising silicon dioxide.

29. The method of claim 25, wherein said charge trapping dielectric layer comprises silicon nitride.

30. The method of claim 25, wherein said first layer of polysilicon has a thickness around 300 Angstroms, and said layer of silicon nitride has a thickness around 300 Angstroms.

31. The method of claim 25, wherein said second layer of polysilicon has a thickness around 1500 Angstroms.

32. The method of claim 25, wherein said first layer of polysilicon has a thickness between about 200 Angstroms and about 450 Angstroms, and said layer of silicon nitride has a thickness between about 200 Angstroms and about 450 Angstroms.

33. The method of claim 25, wherein said second layer of polysilicon has a thickness between about 1300 Angstroms and about 1600 Angstroms.

* * * * *